United States Patent
Rossi et al.

(10) Patent No.: US 7,906,407 B2
(45) Date of Patent: Mar. 15, 2011

(54) SHALLOW TRENCH ISOLATION STRUCTURES AND A METHOD FOR FORMING SHALLOW TRENCH ISOLATION STRUCTURES

(75) Inventors: Nace Rossi, Singapore (SG); Ranbir Singh, Singapore (SG); Arun K. Nanda, Singapore (SG)

(73) Assignee: Agere Systems Inc., Allentown, PA (US)

( * ) Notice: Subject to any disclaimer, the term of this patent is extended or adjusted under 35 U.S.C. 154(b) by 806 days.

(21) Appl. No.: 11/926,469

(22) Filed: Oct. 29, 2007

(65) Prior Publication Data

US 2008/0057672 A1 Mar. 6, 2008

Related U.S. Application Data

(63) Continuation of application No. 11/230,188, filed on Sep. 19, 2005, now abandoned.

(51) Int. Cl.
*H01L 21/76* (2006.01)

(52) U.S. Cl. ........ 438/437; 438/424; 438/221; 438/700; 438/710

(58) Field of Classification Search .................. 438/437, 438/424, 221, 700, 710
See application file for complete search history.

(56) References Cited

U.S. PATENT DOCUMENTS

| | | | |
|---|---|---|---|
| 5,838,055 A | 11/1998 | Kleinhenz et al. |
| 6,245,684 B1 | 6/2001 | Zhao et al. |
| 6,599,839 B1 | 7/2003 | Gabriel et al. |
| 6,825,544 B1 | 11/2004 | Jin |
| 6,828,646 B2 | 12/2004 | Marty et al. |
| 6,849,919 B2 | 2/2005 | Sumino et al. |
| 2003/0003681 A1 | 1/2003 | Xu et al. |
| 2003/0220708 A1 | 11/2003 | Sahin et al. |
| 2004/0067346 A1 | 4/2004 | Hofmann et al. |
| 2005/0070117 A1 | 3/2005 | Jacobs et al. |
| 2005/0282395 A1 | 12/2005 | Chang et al. |

FOREIGN PATENT DOCUMENTS

JP 07201774 * 8/1995

OTHER PUBLICATIONS

Translated abstract of document JP 07201774 A (one page) (1993).*

* cited by examiner

*Primary Examiner* — Nadine G Norton
*Assistant Examiner* — Mahmoud Dahimene

(57) ABSTRACT

A shallow trench isolation structure having a negative taper angle and a method for forming same. A silicon nitride layer formed over a semiconductor substrate is etched according to a plasma etch process to form a first opening therein having sidewalls that present a negative taper angle. The substrate is etched to form a trench therein underlying the first opening. Silicon dioxide fills both the opening and the trench to form the shallow trench isolation structure, with the silicon dioxide in the opening exhibiting a negative taper angle to avoid formation of conductive stringers during subsequent process steps.

57 Claims, 9 Drawing Sheets

SHALLOW TRENCH ISOLATION STRUCTURES AND A METHOD FOR FORMING SHALLOW TRENCH ISOLATION STRUCTURES

REFERENCE TO RELATED APPLICATIONS

The present application is a continuation of U.S. patent application Ser. No. 11/230,188, filed on Sep. 19, 2005 now abandoned, entitled "SHALLOW TRENCH ISOLATION STRUCTURES AND A METHOD FOR FORMING SHALLOW TRENCH ISOLATION STRUCTURES," by Nace Rossi, et al. The above-mentioned application is commonly assigned with the present application and incorporated herein by reference.

FIELD OF THE INVENTION

The present invention relates generally to integrated circuits and more particularly to a method for forming a shallow trench isolation (STI) structure within an integrated circuit and to a shallow trench isolation structure formed according to the method.

BACKGROUND OF THE INVENTION

Integrated circuits (or chips) typically comprise a silicon substrate and semiconductor devices, such as transistors, formed from doped regions within the substrate. Interconnect structures disposed in parallel-like layers overlying the semiconductor substrate provide electrical connection between doped regions to form electrical devices and circuits. A conventional interconnect system comprises a plurality of substantially vertical conductive vias or plugs interconnecting substantially horizontal conductive traces or runners, with a dielectric layer disposed between two vertically adjacent horizontal conductive traces.

Within an integrated circuit substrate, it may be necessary to isolate or separate certain doped regions to avoid the effects of parasitic devices that are formed by the interaction of adjacent doped regions. A CMOSFET device (complimentary metal-oxide semiconductor field effect transistor) comprises an n-channel and a p-channel metal-oxide semiconductor field effect transistor (MOSFET) formed in oppositely doped adjacent wells. The MOSFETS each further comprise source and drain regions separated by a channel, a silicon dioxide gate formed over the channel and a doped polysilicon gate electrode formed over the silicon dioxide gate.

A parasitic bipolar structure, e.g., a p-n-p-n thyristor, is formed by the adjacent wells and the doped source/drain regions formed therein. The thyristor is inoperative (off) under normal CMOSFET operating conditions. However, under certain bias conditions the p-n-p regions supply base current to the n-p-n regions, causing a large leakage current between adjacent MOSFETS that can latch-up the CMOS device. Isolation structures are conventionally formed between adjacent MOSFETS to prevent leakage current flow.

A thick oxide (silicon dioxide) region, formed according to a local oxidation of silicon (LOCOS) process or according to a shallow trench isolation (STI) process, electrically isolates adjacent transistors and their doped regions (and other devices formed in the integrated circuit) to minimize leakage current and reduce these parasitic effects.

The local oxidation of silicon process forms recessed LOCOS isolation regions in non-active areas (also referred to as field regions) of the semiconductor substrate. For example, LOCOS regions are formed between the PMOSFET and NMOSFET devices of a CMOS device. According to a one LOCOS process, a layer of silicon nitride is deposited over the substrate and patterned according to conventional masking and etching steps to form openings that expose underlying silicon substrate regions. The isolating LOCOS regions are formed by oxidizing the exposed silicon through the openings. No oxidation occurs in the regions masked by the silicon nitride.

An STI structure comprises a dielectric-filled substrate trench (about 3000 Angstroms deep) that electrically isolates doped regions of active devices, including CMOS devices, MOSFETS and bipolar junction transistors. Shallow trench isolation structures enjoy certain advantages over the LOCOS structures as the trenches consume a smaller surface area and exhibit a flatter upper surface topology than the LOCOS structures (which is beneficial for forming the subsequent overlying material layers). STI structures are especially useful for device sizes below about 0.25 microns. Since the shallow trench isolation structure consumes less substrate surface than the LOCOS structure, additional transistors per unit area can be fabricated in an integrated circuit employing STI isolation techniques. STI structures also provide superior isolation because sharp corners formed at the bottom of the STI trench create voltage barriers that tend to block leakage currents between adjacent doped regions. LOCOS regions generally present rounded corners and thus may permit some leakage current.

As is known, a plurality of integrated circuits are fabricated in a semiconductor wafer, each integrated circuit comprising doped regions formed in a wafer substrate, with dielectric layers and conductive interconnect layers formed over an upper surface of the substrate. FIGS. 1-6 are cross-sectional views, not drawn to scale, illustrating successive prior art processing steps across a common plane for forming a shallow trench isolation structure in a substrate of one integrated circuit of the plurality of integrated circuits.

A semiconductor substrate 30 in FIG. 1 comprises spaced-apart doped regions 32. It is desired to isolate the doped regions 32 with a shallow trench isolation structure therebetween. A stress-reducing silicon dioxide layer 36 (also referred to as a pad oxide layer 36) is deposited or grown over an upper surface 37 of the substrate 30. Next, a silicon nitride layer 38 is deposited (typically according to a low pressure chemical vapor deposition process) over the silicon dioxide layer 36. As is known, when a silicon nitride layer is formed directly on a substrate, it imposes stresses on the substrate, with the stresses increasing with increasing thickness of the silicon nitride layer. The pad oxide layer 36 isolates the substrate 30 from the silicon nitride layer 38 to reduce the effects of the stresses on the semiconductor substrate 30.

A photoresist layer 40 is deposited, exposed and developed according to known processes to form an opening 41 therein.

Using the photoresist layer 40 as an etch mask, an opening 46 (see FIG. 2) is formed in the silicon nitride layer 38 and the pad oxide layer 36, preferably using a plasma etching process. During the etching process, sidewalls 47 of the opening 46 are formed with a positive taper angle, i.e., the sidewalls 47 are inclined such that an opening size decreases in a direction toward a bottom surface of the opening. Typically, the etch process comprises a plasma etch during which oxygen and a fluorine-containing gas, such as C2F6 and/or CHF3, are supplied to the etch chamber at predetermined fixed flow rates while the chamber is maintained at a predetermined fixed pressure and input power. The CHF3 is conventionally used to etch the pad oxide layer 36, as it provides some selectivity to the underlying silicon of the silicon substrate 30.

The photoresist layer 40 is removed and the wafer is cleaned. As shown in FIG. 3, using the opening 46 as a mask, a trench 48 is formed in the silicon substrate 30 during an etching step, conventionally comprising a plasma dry etch using a mixture of chlorine, in the form of CF2, and HBr. The positive taper angle in the sidewalls 47 of the opening 46 cause the formation of positively-tapered sidewalls 49.

A trench silicon dioxide liner 50 is formed or deposited in the trench 48. See FIG. 4.

As illustrated in FIG. 5, an STI structure 55 is formed within the trench 48 following a silicon dioxide deposition (e.g., a high density plasma oxide deposition), during which silicon dioxide is also deposited on an upper surface 59 of the silicon nitride layer 38. A chemical-mechanical polishing (CMP) step removes the silicon dioxide from the upper surface 59, stopping on the silicon nitride layer 38. Since the CMP polishing rate for silicon dioxide is greater than the CMP polishing rate for silicon nitride, an upper surface 60 of the STI structure 55 is recessed below the upper surface 59 of the silicon nitride layer 38.

To complete formation of the STI structure 55, the wafer is cleaned, the silicon nitride layer 38 and the pad oxide layer 36 are removed using known processes and finally the wafer is cleaned again. FIG. 6 illustrates the structural elements following completion of these processing steps.

As can be seen from FIG. 6, due to the positive taper angle of the sidewalls 47 and 49 (see FIG. 3) sidewalls 67 and 68 of the STI structure 55 form an acute angle with the upper surface 37. It is known that conventional cleaning steps following formation of the STI structure 55 may cause formation of a notch in regions 69 of the sidewalls 67 and 68. The positive taper angle of the sidewalls 67 and 68 together with the notches formed within the regions 69 may weaken the STI structure 55 and raise the possibility of damaging the STI structure 55 during subsequent processing steps.

During deposition of a gate polysilicon layer on the upper surface 37, undesired polysilicon stringers can form around the sidewalls 67 and 68 and left and right corners 64 and 66 due to the positive taper angle profile of the sidewalls 67 and 68. The stringers may create short circuits that defeat the STI isolation function, thereby degrading performance of the integrated circuit. Thus a process technology and STI structure shape is desired that avoids formation of the polysilicon stringers.

According to one technique, to reduce the probability of polysilicon stringers, it is known to minimize the formation of notches as described above by reducing a duration of a clean step (typically a hydrofluoric acid clean) that follows removal of the silicon nitride layer 38 and the pad oxide layer 36. However, it is also known that a shorter cleaning step causes nitride residues and contaminants to remain on the substrate 30, possibly causing undesirable short circuits or leakage current within the STI structure 55 and the substrate 30.

To improve isolation between doped regions, it is desired that the STI structure extend slightly above (up to about 300 Å) the upper surface 37 of the substrate 30. Thus it is not desired to form the STI structures flush with the upper surface 37.

BRIEF SUMMARY OF THE INVENTION

According to one embodiment, the present invention comprises a method for forming a shallow trench isolation structure in an integrated circuit. The method comprises providing a semiconductor layer; forming a material layer overlying the semiconductor layer; etching the material layer to form an opening therein, wherein sidewalls of the opening present a negative taper angle; etching the semiconductor layer through the material layer to form a trench in the semiconductor layer and forming insulating material in and above the trench, wherein sidewalls of the insulating material exhibit a negative taper angle above the semiconductor layer.

According to another embodiment of the invention, a semiconductor device, comprises a semiconductor layer; a device isolation structure formed in the semiconductor layer, the device isolation structure further comprising: a trench disposed within the semiconductor layer; an insulating material disposed within the trench, an upper region of the insulating material extending above an upper surface of the semiconductor layer, the upper region having sidewalls presenting a negative taper angle with respect to the semiconductor layer and upper regions of the sidewalls comprising a material other than the insulating material.

BRIEF DESCRIPTION OF THE DRAWINGS

The present invention can be more easily understood and the advantages and uses thereof more readily apparent when the following detailed description of the present invention is read in conjunction with the figures wherein.

DETAILED DESCRIPTION OF THE INVENTION

Before describing in detail the particular method and apparatus according to the present invention, it should be observed that the present invention resides primarily in a novel and non-obvious combination of elements and process steps. Accordingly, so as not to obscure the disclosure with details that will be readily apparent to those skilled in the art having the benefit of the description herein, in the description that follows certain elements and process steps have been described with lesser detail, while the drawings and specification describe in greater detail other elements and steps pertinent to understanding the invention. The following embodiments are not intended to define limits as to the structure or use of the invention, but only to provide exemplary constructions. The embodiments are permissive rather than mandatory and illustrative rather than exhaustive.

The process steps and structures described below do not comprise a complete process flow for fabricating integrated circuit devices or a completed device. Only the process steps and structures necessary to understand the present invention are described.

Figure 1:
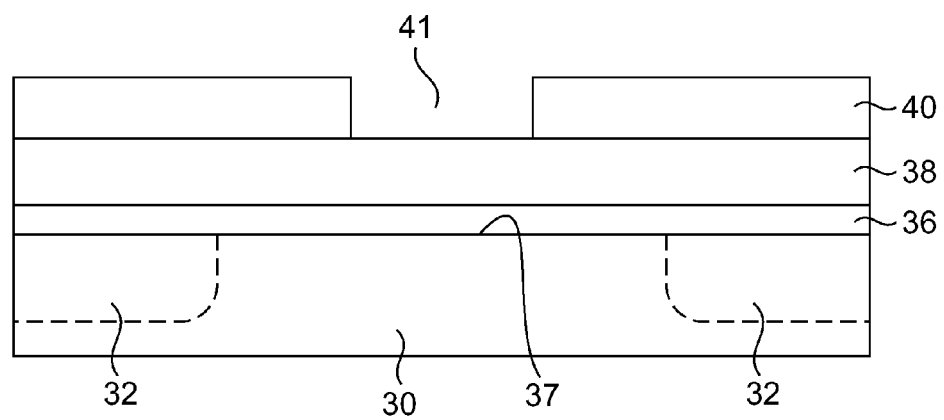
FIGS. 1-6 are cross-sectional views of a substrate during successive processing steps to form a prior art shallow trench isolation structure.
Figure 2:
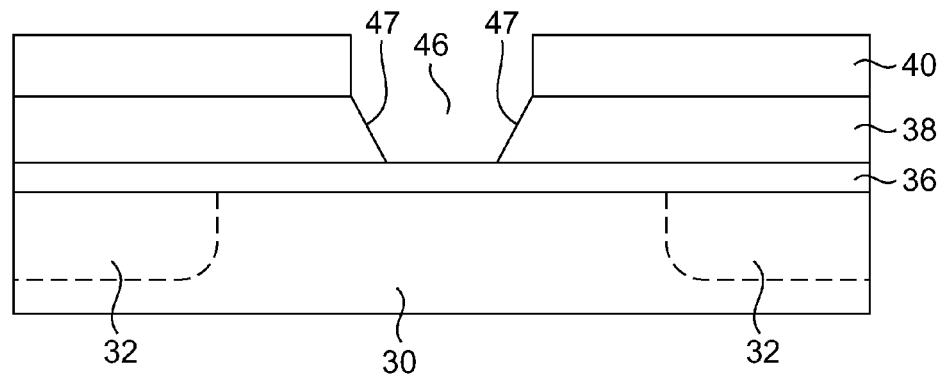
Figure 3:
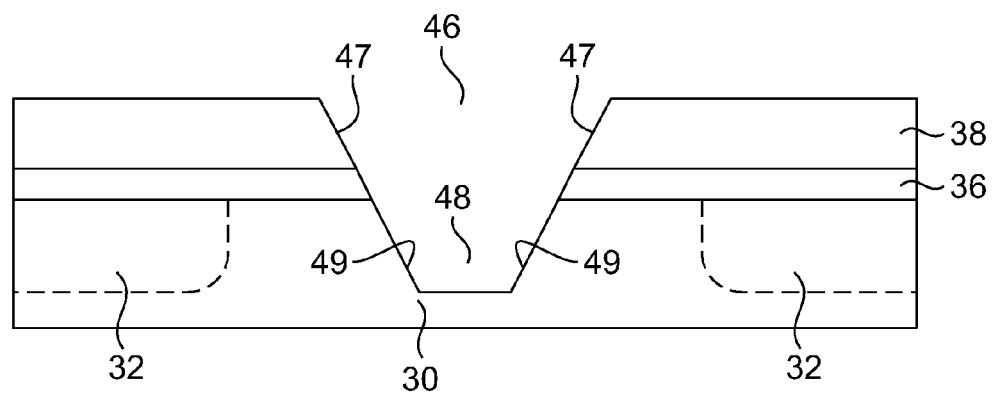
Figure 4:
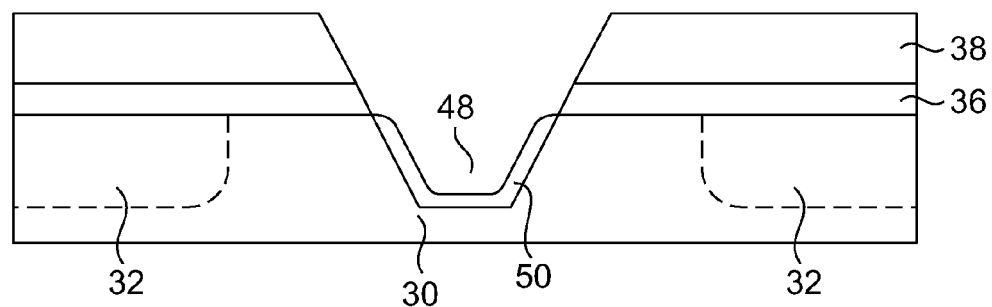
Figure 5:
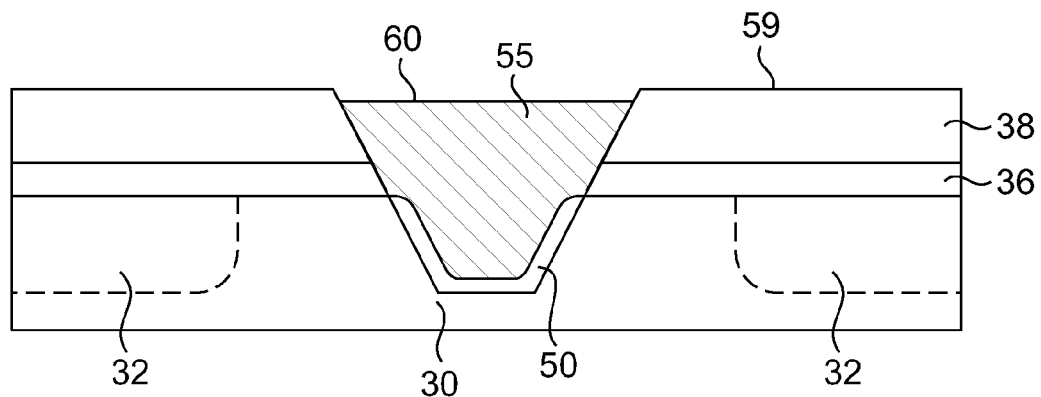
Figure 6:
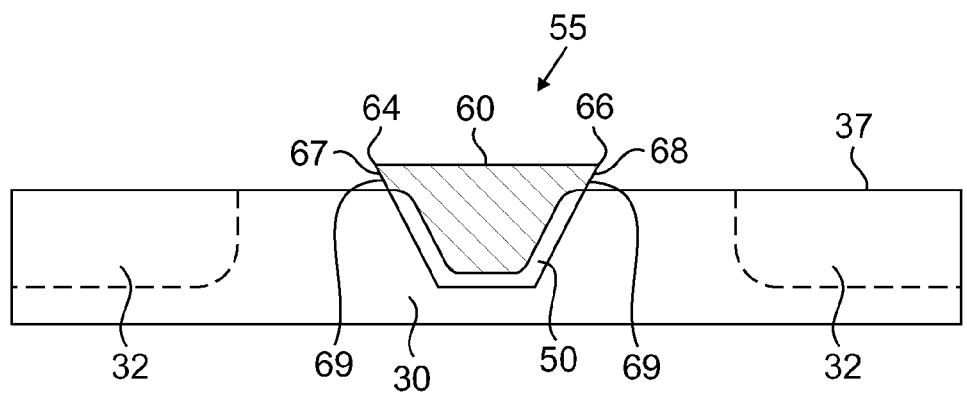

The present invention comprises a technique for forming an STI structure having negative taper angle sidewalls above an upper substrate surface (i.e., the sidewalls form an obtuse angle with the upper substrate surface or the sidewalls of the opening are inclined such that a size of the opening increases in a direction toward a bottom surface of the opening) in contrast to the positive taper angle sidewalls (i.e., the sidewalls 67 and 68 form an acute angle with the upper surface 37 as illustrated in FIG. 6) formed according to the prior art processes.

Figure 7:
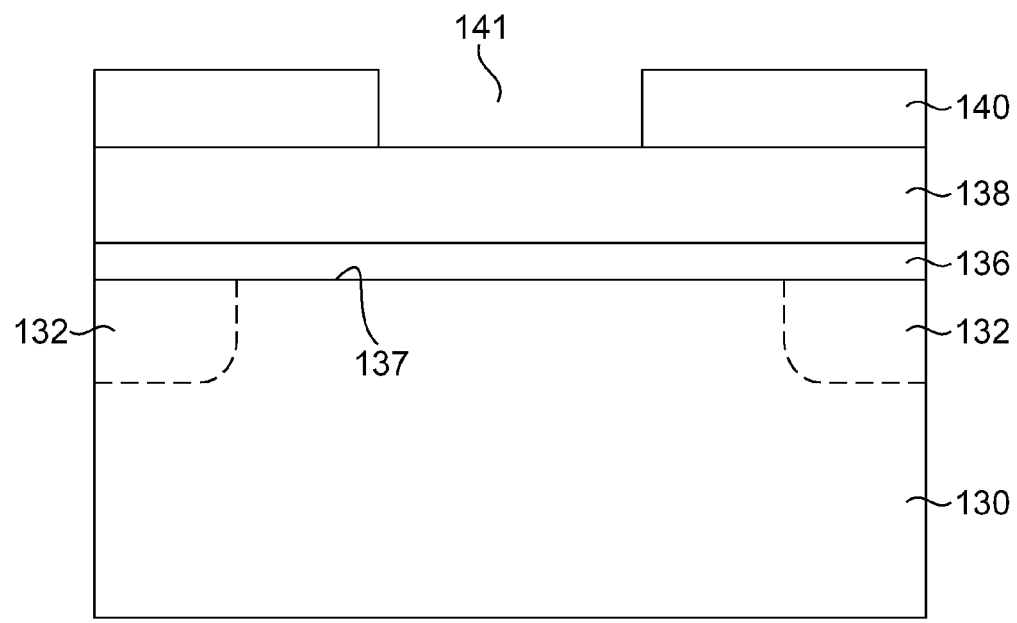
FIGS. 7-14 are cross-sectional views of a substrate during successive processing step to form a shallow trench isolation structure according to the teachings of one embodiment of the present invention.

A preferred process for forming the negative taper angle STI structure begins with a structure illustrated in FIG. 7. A semiconductor substrate 130 comprises spaced-apart doped regions 132. It is desired to isolate the doped regions 132 with a shallow trench isolation structure therebetween. A stress-reducing silicon dioxide or pad oxide layer 136 is deposited or grown over an upper surface 137 of the substrate 130. Next, a silicon nitride layer 138 (one example of a hard mask material layer, other hard mask materials can also be used in lieu of silicon nitride) is deposited (typically according to a low pressure chemical vapor deposition process) over the silicon dioxide layer 136. A photoresist layer 140 is deposited, exposed and developed according to known processes to form an opening 141 therein. Although silicon nitride is a preferred material because of its selectivity relative to silicon dioxide during a subsequent chemical mechanical polishing step described below and its suitability for use with photolithography processes, also described below, other materials with similar properties, such as silicon oxynitride, can also be used.

Using the photoresist layer 140 as an etch mask, an opening 170 (see FIG. 8) is formed in the silicon nitride layer 138 (where the silicon nitride layer 138 is about 1000-1600 Angstroms thick) according to a plasma etch process of the present invention. During the etch process certain etch parameters are adjusted, including one or more of an etch chamber pressure, a precursor gas flow rate (where the precursor comprises a fluorine-containing gas such as C2F6 or another precursor gas suitable for etching nitride as known in the art) and a power applied to create the plasma within the chamber to control a slope of the sidewalls formed in the silicon nitride layer 138. A chamber temperature may also be adjusted during the etch, although the temperature changes only very slowly due to the mass of the chamber and its constituent elements. Sidewalls 172 having a negative taper angle are formed in response to one or more of these parameter adjustments during the plasma etch.

According to one embodiment of the present invention increasing the chamber pressure during plasma etch (solely or in addition to the gas flow rate and the power adjustments described above) from a pressure of about 120 mTorr to about 240 mTorr causes the etch process to become more isotropic with respect to the substrate 130, that is, a ratio of the horizontal etch rate and the vertical etch increases or the horizontal etch component increases with respect to the vertical etch component. The sidewall taper angle thus tends toward a negative taper in response to the increase in chamber pressure. Although one or more of the etch parameters as identified above can be adjusted to achieve the negative taper angle sidewalls, the pressure adjustment appears to have a substantial affect on the taper angle.

According to another embodiment wherein a plasma etch process employs a mixture of C2F6 and oxygen, a ratio of the fluorine-containing gas concentration to the oxygen concentration is increased from a ratio of about 10:1 (that forms a substantially vertical etch) to a ratio of about 12:1 during plasma etching. The ratio change can be accomplished by increasing the fluorine concentration, by increasing the SCCM flow rate of the fluorine-containing gas (where SCCM is the flow rate expressed in units of standard cubic centimeter per minute) by lowering the oxygen concentration or by lowering the SCCM flow rate of the oxygen-containing gas. Increasing the precursor gas flow rate (e.g., the fluorine containing gas) increases the supply of fluorine gas molecules in the etch chamber, thereby increasing the etch rate since fluorine is the primary etching agent.

In an exemplary embodiment of the present invention, the oxygen flow rate is about 10 SCCM and the C2F6 flow rate is increased during the etch process from an initial value of about 100 SCCM to about 120 SCCM, increasing the fluorine-to-oxygen flow rate ratio from about 10:1 to about 12:1.

During a conventional plasma etch process the power applied to the plasma etch chamber is about 450 W. In response to a power increase to about 750 W according to another embodiment of the present invention, a dissociation rate of the precursor gas increases, thereby also contributing to an increased etch rate.

Figure 8:
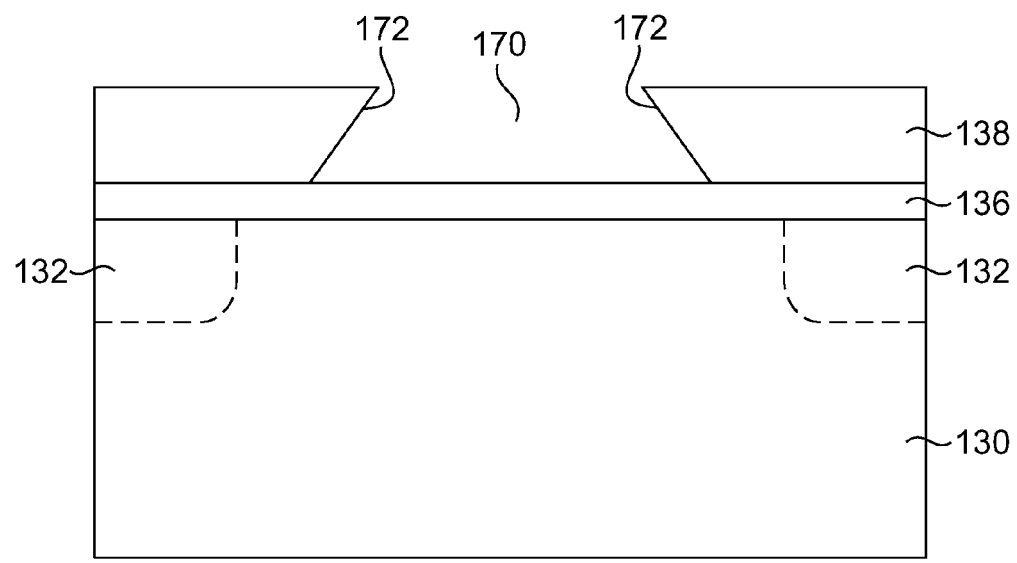

Thus increasing the chamber pressure increases the horizontal etch component, relative to the vertical etch component, while the ratio of the fluorine-containing gas to oxygen and the chamber power are increased to increase the etch rate. A combination of these there parameter adjustments is preferred, but not required, to form the desired negative taper angle sidewalls as illustrated in FIG. 8. According to one embodiment of the present invention, the pressure, the gas ratio and the power are all adjusted during the etch process as described above to form the negative taper angle sidewalls.

According to yet another embodiment, during the etch process the chamber temperature is adjusted from about 10° C. to about 25° C. This adjustment has a desired affect to increase the etch rate, but the time required to increase the temperature from about 10° C. to about 25° C. is considerably longer than the time required to increase the chamber pressure, the gas ratios and the chamber power. Additionally, the etch parameter adjustments described above can be made to achieve the desired negative taper angle sidewalls while the chamber temperature is maintained between about 10° C. and 25° C.

According to one embodiment of the present invention, one or more of the identified etch parameters are adjusted during the etch process according to one or more of various time-based adjustment profiles to achieve the negative taper angle. Such time-based profiles include a linear function of time (i.e., increased linearly with time), a nonlinear function of time and a plurality of sequential step adjustments with time. Further, all parameters can be adjusted concurrently or parameter adjustments can be staggered or delayed relative to other parameter adjustments. Further, the profiles can be adjusted to achieve a specific negative taper angle. In one embodiment, the parameter adjustments are made over an etch interval of about 70 to 90 seconds. For example, according to one adjustment profile, the pressure is increased linearly from about 120 mTorr to about 240 mTorr during an interval of between 70 seconds and 90 seconds. According to another adjustment profile one or more of the chamber pressure, the gas ratio and the chamber power are increased from their respective initial values to their respective final values in three approximately equal steps. For example, in one embodiment the pressure is increased from 120 mTorr to 180 mTorr to 240 mTorr. Concurrently the gas ratio is increased from 10 to 11 to 12 and the plasma power is increased from 450 W to 600 W to 750 W.

It is to be understood that the process parameters set forth are merely exemplary and can be varied by at least +/−10% according to the present invention. Further, these parameters can be varied to achieve different sidewall taper angles. As is known by those skilled in the art, variations and anomalies in fabrication process parameters, for example due to the use of certain process tools, should be considered and may require modification to the etch parameters set forth above. As can further be appreciated by those skilled in the art, the modification of one etch parameter may require a corresponding modification to other etch parameters. For example, increasing the plasma power may permit a reduction in the etch duration.

The adjustment values, set forth above, apply generally to a single plasma power source etch chamber. For a high density plasma etch tool (having dual plasma power sources) the requisite pressure values may vary from those set forth above, as is known by those skilled in the art, and the power and the gas ratio may also be adjusted accordingly.

Figure 9:
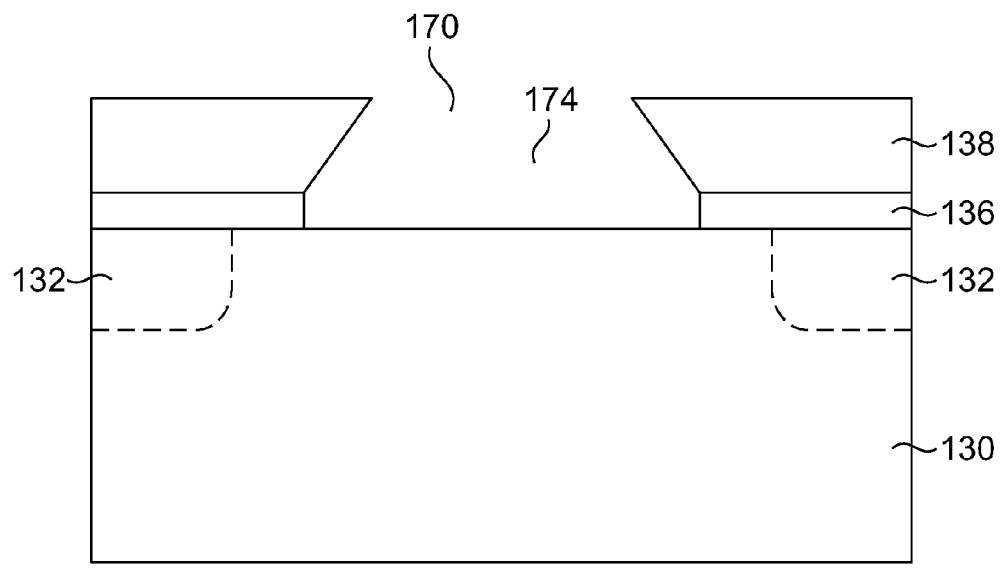

Continuing with FIG. 9, after etching to form the opening 170 in the silicon nitride layer 138, the photoresist layer 140 is removed and an opening 174 having sidewalls 178 is formed in the silicon dioxide or pad oxide layer 136. Typically this layer is about 100-150 Å thick.

Figure 10:
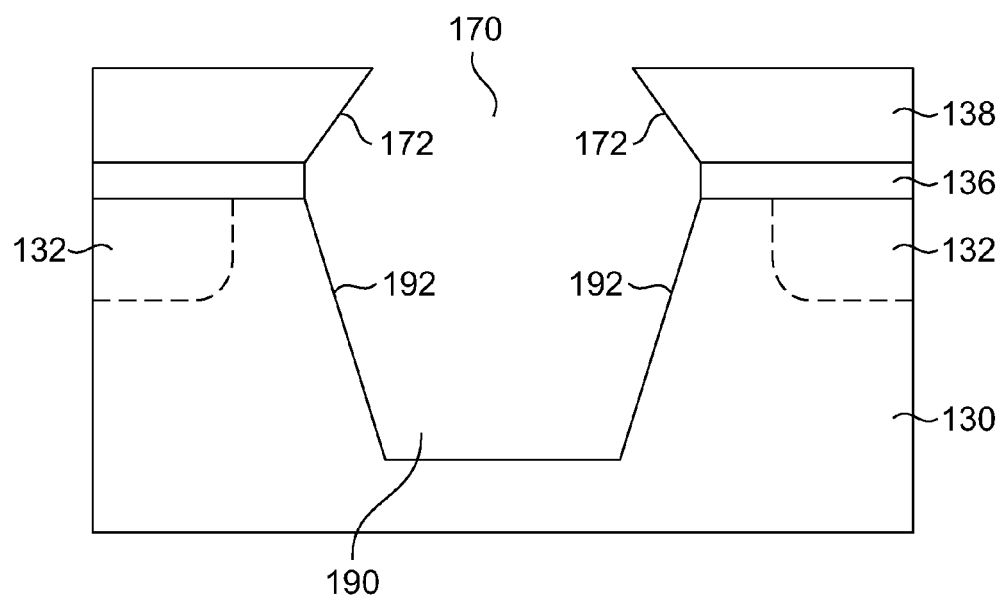

As illustrated in FIG. 10, a trench 190 having sidewalls 192 is formed in the substrate 130 according to a known silicon etch process, including a silicon plasma etch process. The substrate etch is terminated after a predetermined etch duration or according to an etch endpoint technique. Although the trench sidewalls 192 are illustrated as having a positive taper, this is not necessarily required to practice the teachings of the present invention.

Figure 11:
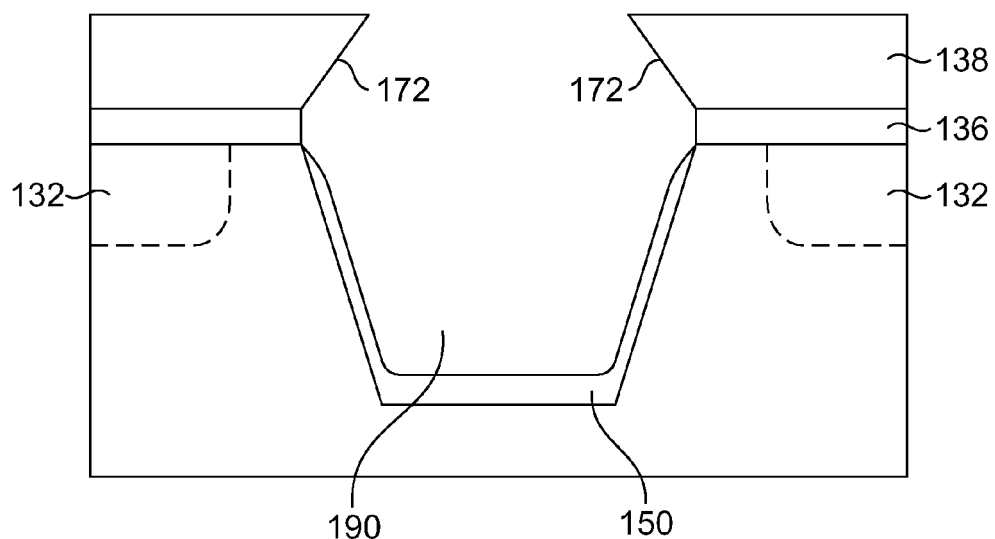

A silicon dioxide liner 150 (see FIG. 11) is then formed or deposited in the trench 190. Typically, the liner 150 is formed by oxidizing exposed silicon in the trench 190 to form a high quality silicon dioxide material layer. However, it may be possible to form a suitably high-quality liner 150 by depositing silicon dioxide.

Figure 12:
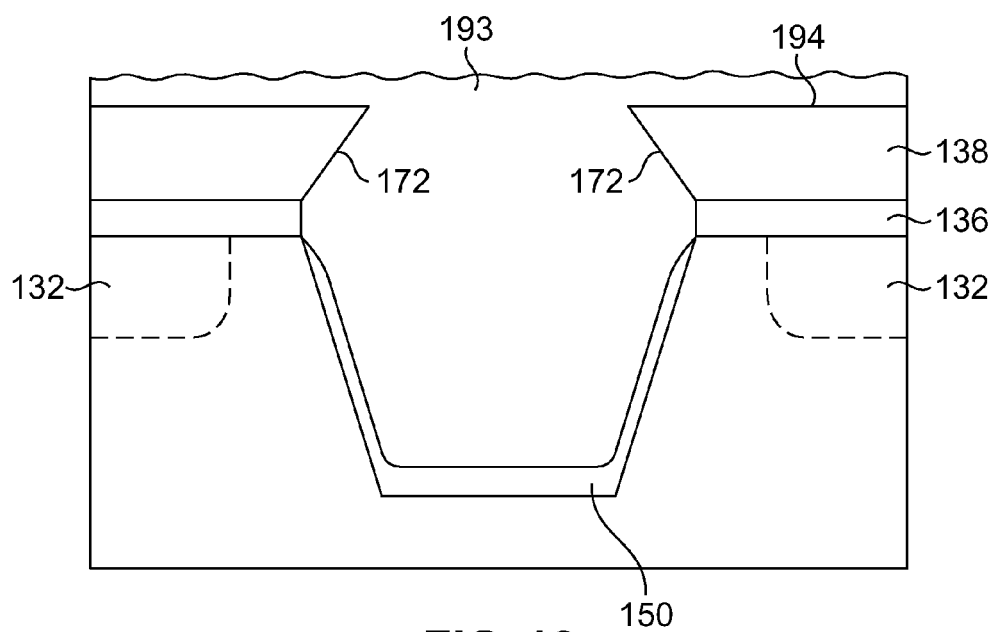

As illustrated in FIG. 12, a shallow trench isolation structure 193 is formed by depositing silicon dioxide within the trench 190 and on an upper surface 194 of the silicon nitride layer 138. The negative profile of the sidewalls 172 determines the profile of an upper region of the STI structure 193.

A CMP step removes the silicon dioxide from the upper surface 194, stopping on the silicon nitride layer 138. The wafer is then cleaned. It is desired to remove all of the silicon dioxide on the upper surface 194 during the CMP and cleaning steps, as residual silicon dioxide impedes later removal of the silicon nitride layer 138. Residual silicon nitride on the upper surface 194 may lead to failure of the active devices formed in the substrate 130.

Figure 13:
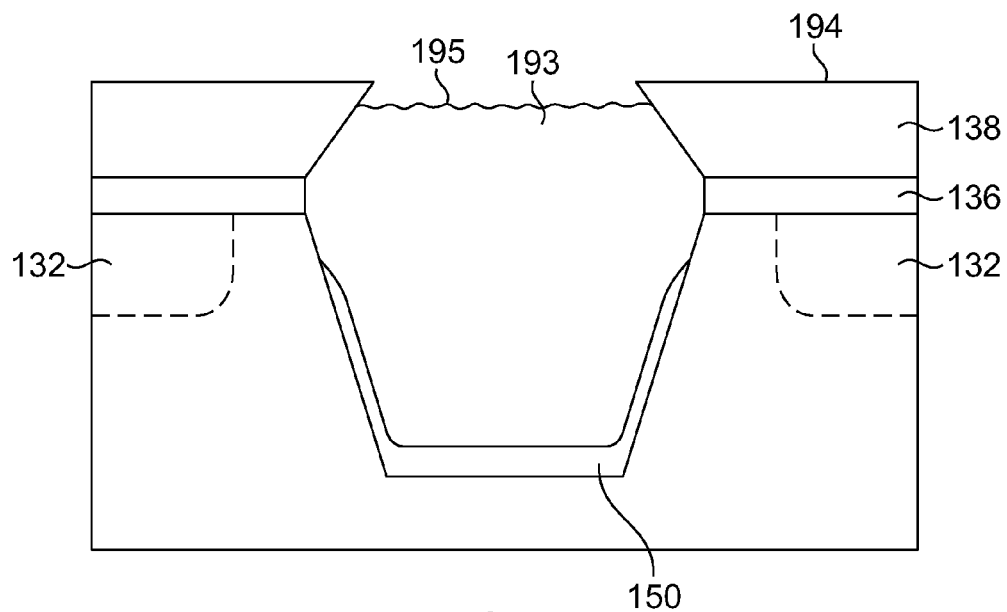

Since the CMP removal rate for silicon dioxide is higher than the CMP removal rate for silicon nitride, an upper surface 195 of the STI structure 193 is recessed below the upper surface 194. See FIG. 13.

Figure 14:
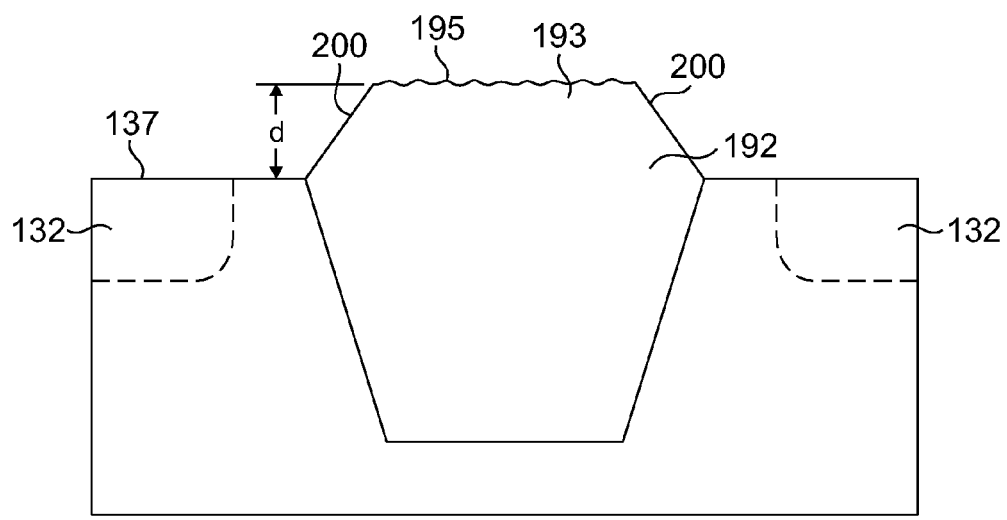

The silicon nitride layer 138 and the pad silicon dioxide layer 136 are removed and the wafer is cleaned again. See the structure of FIG. 14. Typically, a distance "d" (defined as a height of the surface 195 above the surface 137) is up to about 300 Angstroms. Erosion of the silicon dioxide within the trench 190 during the CMP step should be considered and the process steps adjusted accordingly to ensure the distance "d" is sufficient to avoid forming polysilicon wrap-ups during the polysilicon deposition step, thereby avoiding current leakage through the wrap-ups. Note, sidewalls 100 of the STI structure 193 exhibit a negative taper angle. In this ideal representation, no regions of positive taper angle are present.

In another embodiment of the invention, the step of removing only the pad silicon dioxide layer 136 (the results of that step are illustrated in FIG. 9) is not separately performed, but instead the pad silicon dioxide layer 136 is removed during substrate trench etching to form the opening 190.

In yet another embodiment the pad silicon dioxide layer 136 is etched after etching of the silicon nitride layer 138 (where the silicon nitride layer 138 is etched according to the teachings of the present invention), within the same chamber but using different etch chemistries. The pad silicon dioxide etch employs an etch chemistry having a high silicon selectivity. After completing the silicon nitride etch, a fluorine-containing gas such as CHF3 is added to the chamber and the oxygen flow is reduced or terminated to increase the silicon selectivity of the etch.

Figure 15:
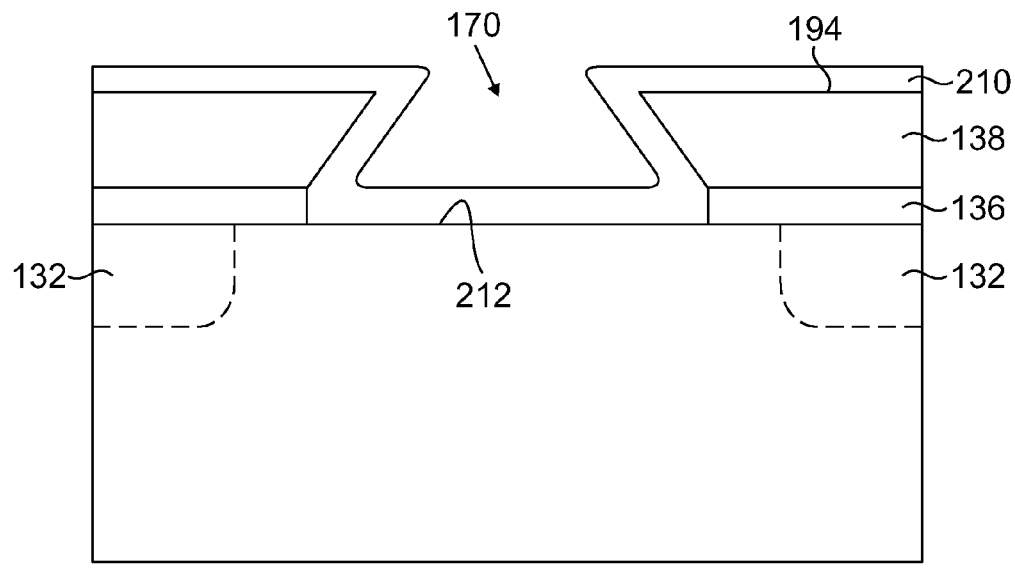
FIG. 15-17 are cross-sectional views of a substrate during successive processing steps to form a shallow trench isolation structure according to another embodiment of the present invention.

Yet another embodiment of the invention is illustrated beginning in FIG. 15. After etching the silicon nitride layer 138 to form the trench 170 having sidewalls 172 as illustrated in FIG. 8, a silicon dioxide layer 210 is deposited by a CVD (chemical vapor deposition) process (such as a low pressure chemical vapor deposition process, LPCVD) or a PECVD process (plasma-enhanced chemical vapor deposition process) over the upper surface 194 of the silicon nitride layer 138 and over a surface 212 of the substrate 130. Alternatively, the layer 210 comprises silicon oxynitride deposited by a PECVD or an LPCVD process.

Figure 16:
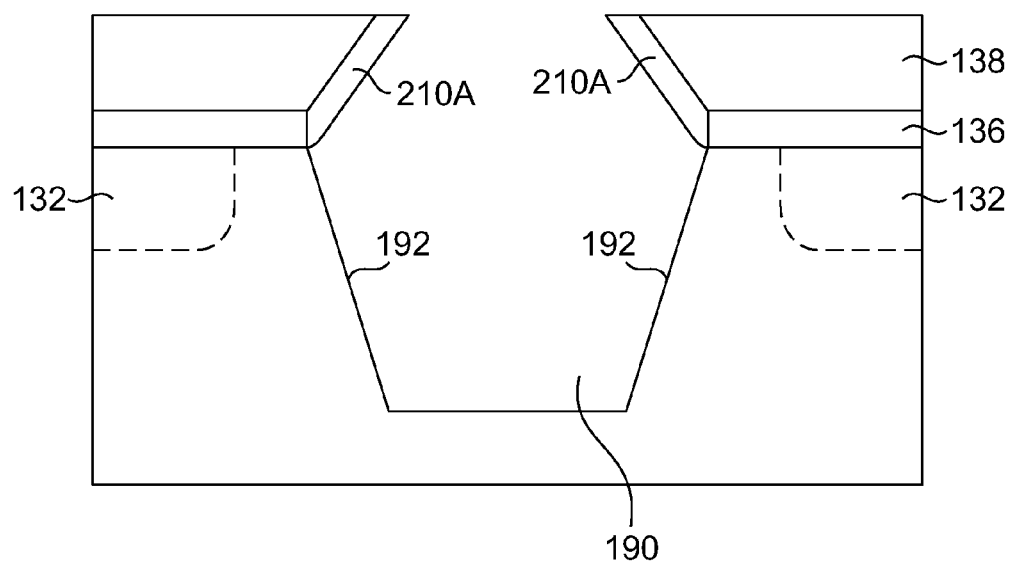

The trench 190 having sidewalls 192 is formed in the substrate 130 according to an etch process during which regions of the layer 210 are also removed. See FIG. 16. The substrate etch is terminated after a predetermined etch duration or according to an etch endpoint technique. Although the trench sidewalls 192 are illustrated as having a positive taper, this is not necessarily required. Following the trench etch, regions 210A of the layer 210 remain within the opening 170 adjacent the sidewalls 172. In one embodiment the regions 210A are about 200-400 Angstroms thick.

Figure 17:
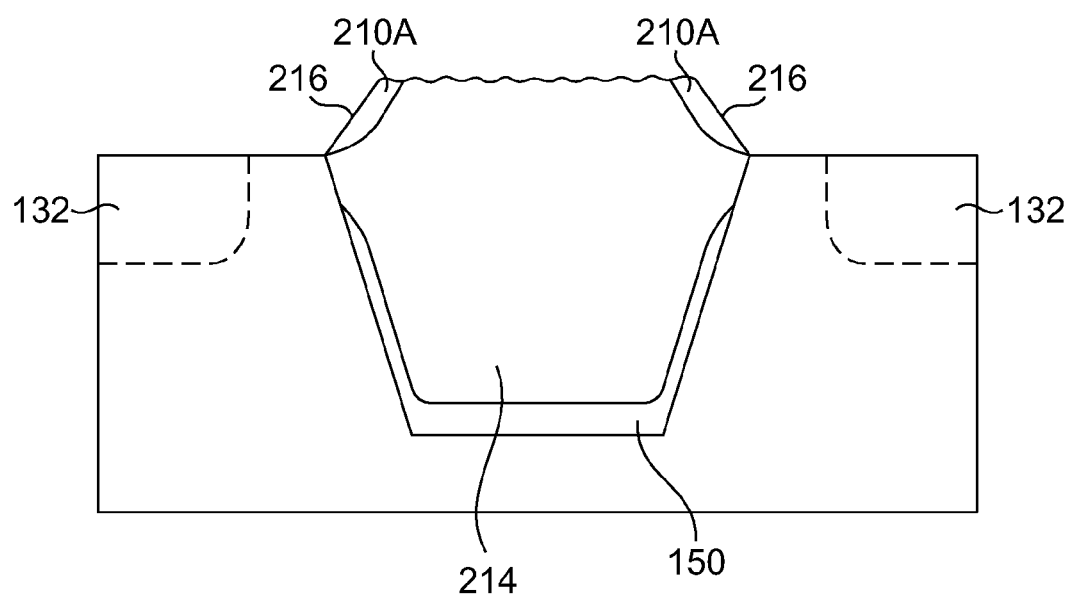

The silicon dioxide liner 150 is then formed or deposited in the trench 190 and an STI structure 214 is formed within the trench 190. The wafer is cleaned, the silicon nitride layer 138 and the pad silicon dioxide layer 136 are removed and the wafer is cleaned again. See the structure illustrated in FIG. 17. Note sidewalls 216 of the STI structure 193 exhibit a negative taper angle and include the regions 210A comprising LPCVD silicon dioxide or silicon oxynitride. The regions 210A remain after the silicon nitride layer 138 and the pad silicon dioxide layer 136 are removed because the etchants employed to remove the layers 136 and 138 are less selective to a material of the regions 210A than to the silicon nitride of the layer 138 and the silicon dioxide of the layer 136. The regions 210A protect corners of the STI structure 193 from damage during subsequent processing steps.

The STI structures 93 and 214 formed according to the various embodiments of the present invention do not exhibit the disadvantageous negative taper angle and notches that are known to occur according to the prior art processes. Therefore, the STI structures 193 and 214 avoid formation of polysilicon stringers and short circuits caused thereby when the polysilicon gate is formed later. By reducing or eliminating the polysilicon shorts and current leakage paths fabrication processes employing the present invention enjoy a higher, more consistent yield and improved device performance.

An architecture and process have been described as useful for forming STI structure in a semiconductor substrate. Specific applications and exemplary embodiments of the invention have been illustrated and discussed, which provide a basis for practicing the invention in a variety of ways and in a variety of circuit structures. Numerous variations are possible within the scope of the invention. Features and elements associated with one or more of the described embodiments are not to be construed as required elements for all embodiments. The invention is limited only by the claims that follow.

What is claimed is:

1. A method for forming a shallow trench isolation structure in an integrated circuit, the method comprising:
    providing a semiconductor layer;
    forming a material layer overlying the semiconductor layer;
    etching the material layer to form an opening therein, wherein sidewalls of the opening present a negative taper angle that extends from the top of the opening to the bottom of the opening;
    etching the semiconductor layer through the material layer to form a trench in the semiconductor layer, wherein the sidewalls of the trench present a positive taper angle that extends from the top to the bottom of the trench; and
    forming insulating material in and above the trench, wherein sidewalls of the insulating material exhibit a negative taper angle above the semiconductor layer.

2. The method of claim 1 wherein the step of etching the material layer comprises etching the material layer according to a plasma etching process controlled by process parameters comprising an etch chamber pressure, a precursor gas flow rate and an etch chamber power, and wherein the method further comprises adjusting one or more of the process parameters during the step of etching the material layer to affect a taper angle of the sidewalls.

3. The method of claim 2 wherein the process parameters further comprises a chamber temperature.

4. The method of claim 2 wherein a slope of the taper angle is responsive to the step of adjusting one or more of the process parameters.

5. The method of claim 2 wherein the step of adjusting one or more of the process parameters comprises adjusting one or more of the process parameters linearly with time, non-linearly with time or in multiple steps with time.

6. The method of claim 2 wherein an etch gas comprises a fluorine-containing gas.

7. The method of claim 1 further comprising removing the material layer.

8. The method of claim 1 further comprising forming a silicon dioxide layer overlying the substrate and forming the material layer overlying the silicon dioxide layer.

9. The method of claim 1 wherein the step of etching the material layer comprises etching the material layer using a plasma etching process employing a fluorine-containing gas and oxygen and adjusting a ratio of the fluorine-containing gas and the oxygen and increasing an etch chamber pressure.

10. The method of claim 9 wherein the ratio is between about 10:1 and 12:1.

11. The method of claim 9 wherein the step of adjusting the ratio comprises adjusting the ratio from about 10:1 to about 12:1 during the step of etching the material layer.

12. The method of claim 9 wherein the fluorine-containing gas comprises C2F6.

13. The method of claim 9 further comprising controlling the ratio by adjusting one or more of a flow rate of the fluorine-containing gas, a flow rate of the oxygen, a concentration of the fluorine-containing gas and a concentration of the oxygen.

14. The method of claim 9 wherein a temperature of the plasma etching process is maintained substantially constant during the step of etching the material layer.

15. The method of claim 1 wherein the step of etching the material layer further comprises etching the material layer using a plasma etching process and increasing a plasma chamber power and increasing an etch chamber pressure.

16. The method of claim 15 wherein the plasma chamber power is between about 450 W and 750 W.

17. The method of claim 15 wherein the step of adjusting the plasma chamber power comprises adjusting the plasma chamber power from about 450 W to about 750 W during the step of etching the material layer.

18. The method of claim 1 wherein the step of etching the material layer further comprises etching the material layer according to a plasma etching process and adjusting a pressure within a plasma etching process chamber.

19. The method of claim 18 wherein the step of adjusting further comprises increasing the pressure during the step of etching the material layer.

20. The method of claim 18 wherein the pressure is between about 120 mTorr and 240 mTorr.

21. The method of claim 18 wherein the step of adjusting further comprises increasing the pressure from about 120 mTorr to about 240 mTorr.

22. The method of claim 1 wherein the step of etching the material layer comprises etching the material layer using a plasma etching process employing a fluorine-containing gas and oxygen, and wherein during the step of etching the material layer a ratio of the fluorine-containing gas to the oxygen is increased and a plasma chamber pressure is increased.

23. The method of claim 22 wherein during the plasma etching process, a plasma chamber power is increased.

24. The method of claim 1 wherein the step of etching the material layer comprises etching the material layer using a plasma etching process and increasing a plasma chamber pressure and a plasma chamber power during the plasma etching process.

25. The method of claim 24 wherein the step of etching the material layer further comprises using a plasma etching process employing a fluorine-containing gas and oxygen, and wherein during the step of etching the material layer a ratio of the fluorine-containing gas to the oxygen is increased.

26. The method of claim 25 wherein the ratio is increases from about 10:1 to about 12:1 during the step of etching the material layer.

27. The method of claim 1 wherein the material layer comprises a hard mask layer.

28. The method of claim 27 wherein the hard mask layer comprises silicon nitride or silicon oxynitride.

29. The method of claim 1 wherein the step of etching the material layer further comprises increasing an etch chamber temperature from about 10° C. to about 25° C.

30. A method for forming a shallow trench isolation structure in an integrated circuit, the method comprising:
    providing a semiconductor layer;
    forming a pad oxide layer overlying the semiconductor layer;
    forming a silicon nitride or a silicon oxynitride layer overlying the pad oxide;
    forming a photoresist layer overlying the silicon nitride or the silicon oxynitride layer;
    forming a first opening in the photoresist layer;
    plasma etching the silicon nitride or the silicon oxynitride layer through the first opening to form a second opening in the silicon nitride or the silicon oxynitride layer, wherein sidewalls of the second opening present a negative taper angle from the top of the second opening to the bottom of the second opening;

etching the semiconductor layer through the second opening to form a trench in the semiconductor layer, wherein the sidewalls of the trench present a positive taper angle that extends from the top to the bottom of the trench; and forming an insulating material in the second opening and in the trench, wherein sidewalls of the insulating material exhibit a negative taper angle above the semiconductor layer.

31. The method of claim 30 further comprising removing the photoresist layer following the step of forming the second opening.

32. The method of claim 30 further comprising removing the silicon nitride or the silicon oxynitride layer and removing the pad oxide layer following the step of forming the insulating material.

33. The method of claim 30 further comprising forming a liner in the trench prior to the step of forming the insulating material.

34. The method of claim 30 wherein the step of plasma etching further comprises increasing a pressure of a plasma etch chamber during the step of plasma etching.

35. The method of claim 34 wherein the step of increasing the pressure further comprises increasing the pressure from about 120 mTorr to about 240 mTorr.

36. The method of claim 34 wherein the step of plasma etching further comprises plasma etching with a fluorine-containing gas and oxygen.

37. The method of claim 36 wherein the step of plasma etching with the fluorine-containing gas and oxygen further comprises increasing a ratio of the fluorine-containing gas to the oxygen during the step of plasma etching.

38. The method of claim 37 wherein the ratio is controllably increased from about 10:1 to about 12:1.

39. The method of claim 34 wherein the step of plasma etching further comprises increasing an etch chamber power during the step of plasma etching.

40. The method of claim 39 wherein the step of increasing the etch chamber power comprises increasing the power from about 450 W to about 750 W.

41. The method of claim 34 wherein the step of plasma etching further comprises increasing an etch chamber temperature from about 10° C. to about 25° C.

42. A method for forming a shallow trench isolation structure in an integrated circuit, the method comprising:
   providing a semiconductor layer;
   forming a first material layer overlying the semiconductor layer;
   etching the first material layer to form a opening therein, wherein sidewalls of the opening present a negative taper angle from the top of the opening to the bottom of the opening;
   forming a second material layer on the sidewalls of the opening;
   etching the semiconductor layer through the opening to form a trench in the semiconductor layer, wherein the sidewalls of the trench present a positive taper angle that extends from the top to the bottom of the trench; and
   forming an insulating material in the opening and in the trench, wherein sidewalls of the insulating material in the opening exhibit a negative taper angle.

43. The method of claim 42 wherein the second material layer comprises silicon dioxide or silicon oxynitride.

44. The method of claim 42 wherein the step of forming the second material layer comprises forming a silicon dioxide material layer according to a chemical vapor deposition process.

45. The method of claim 42 wherein the step of forming the second material layer comprises forming a silicon oxynitride material layer according to a plasma enhanced chemical vapor deposition process or according to a low pressure chemical vapor deposition process.

46. The method of claim 42 wherein the step of forming the second material layer comprises forming the second material layer on the sidewalls and a bottom surface of the opening, and wherein the step of etching the semiconductor layer comprises etching the material layer on the bottom surface.

47. The method of claim 42 wherein the step of etching the first material layer further comprises etching a silicon nitride or a silicon oxynitride layer using a plasma etching process during which an etch chamber pressure is increased.

48. The method of claim 47 wherein the step of etching the first material layer further comprises etching with a fluorine-containing gas and oxygen and increasing a ratio of the fluorine-containing gas and the oxygen during the step of etching.

49. The method of claim 47 wherein the step of etching the first material layer further comprises increasing an etch chamber power during the step of etching.

50. The method of claim 42 further comprising removing the first material layer to expose a region of the insulating material extending above an upper surface of the semiconductor layer.

51. The method of claim 50 wherein the region of the insulating material extending above the surface of the semiconductor layer includes the material of the second material layer.

52. A method for forming a shallow trench isolation structure in an integrated circuit, the method comprising:
   providing a semiconductor layer;
   forming a pad oxide layer overlying the semiconductor layer;
   forming a first material layer overlying the pad oxide layer;
   forming a photoresist layer overlying the first material layer;
   forming a first opening in the photoresist layer;
   plasma etching the first material layer through the first opening to form a second opening in the first material layer, wherein sidewalls of the second opening present a negative taper angle from the top of the second opening to the bottom of the second opening, and wherein the plasma etching step employs a fluorine-containing gas and oxygen;
   increasing a pressure of a plasma etch chamber during the step of plasma etching;
   forming a second material layer on the sidewalls of the second opening;
   etching the semiconductor layer through the second opening to form a trench in the semiconductor layer, wherein the sidewalls of the trench present a positive taper angle that extends from the top to the bottom of the trench; and
   forming an insulating material in the second opening and the trench, wherein sidewalls of the insulating material exhibit a negative taper angle above the semiconductor layer.

53. The method of claim 52 wherein the second material layer comprises silicon dioxide or silicon oxynitride.

54. The method of claim 52 wherein the step of forming the second material layer comprises forming a silicon dioxide material layer according to a chemical vapor deposition process, forming a silicon oxynitride material layer according to a plasma enhanced chemical vapor deposition process or forming a silicon oxynitride material layer according to a low pressure chemical vapor deposition process.

55. The method of claim 52 wherein the step of forming the second material layer further comprises forming the second material layer on the sidewalls and a bottom surface of the opening, and wherein the step of etching the substrate further comprises etching the second material layer on the bottom surface.

56. The method of claim 52 wherein the step of plasma etching the first material layer further comprises plasma etching employing a fluorine-containing gas and oxygen and increasing a ratio of the fluorine-containing gas and oxygen.

57. The method of claim 52 wherein the step of plasma etching the first material layer further comprises increasing an etch chamber pressure.

* * * * *